United States Patent [19]

Spence

[11] Patent Number: 4,692,715

[45] Date of Patent: Sep. 8, 1987

[54] CONSTANT FREQUENCY SIGNAL GENERATOR CIRCUIT AND METHOD

[76] Inventor: Lewis C. Spence, 3084 N.W. 74th Ter., Okeechobee, Fla. 33472

[21] Appl. No.: 835,295

[22] Filed: Mar. 3, 1986

[51] Int. Cl.$^4$ ............................................... H03L 7/06
[52] U.S. Cl. ........................................ 331/2; 331/175
[58] Field of Search ................... 331/1 R, 2, 175; 455/260

[56] References Cited

U.S. PATENT DOCUMENTS 4,227,158 10/1980 Schroeder et al. ................... 331/2

*Primary Examiner*—Eugene R. LaRoche
*Assistant Examiner*—David Mis
*Attorney, Agent, or Firm*—Saidman, Sterne, Kessler & Goldstein

[57] ABSTRACT

An improved apparatus for generating a stable frequency signal is disclosed. A master oscillator provides an output signal having a preselected frequency value X. A main feedback loop, a first feedback loop and a second feedback loop are provided. Deviation of the output signal from the preselected frequency value X causes the second feedback loop to be responsive at twice the frequency rate as that of the first feedback loop. The frequency difference between the values of the first feedback loop and the second feedback loop is used to produce a control signal for the main feedback loop used to control the frequency value X of the output signal. The circuit is self-correcting and exhibits high order short and long term stability. Two embodiments are disclosed.

20 Claims, 13 Drawing Figures

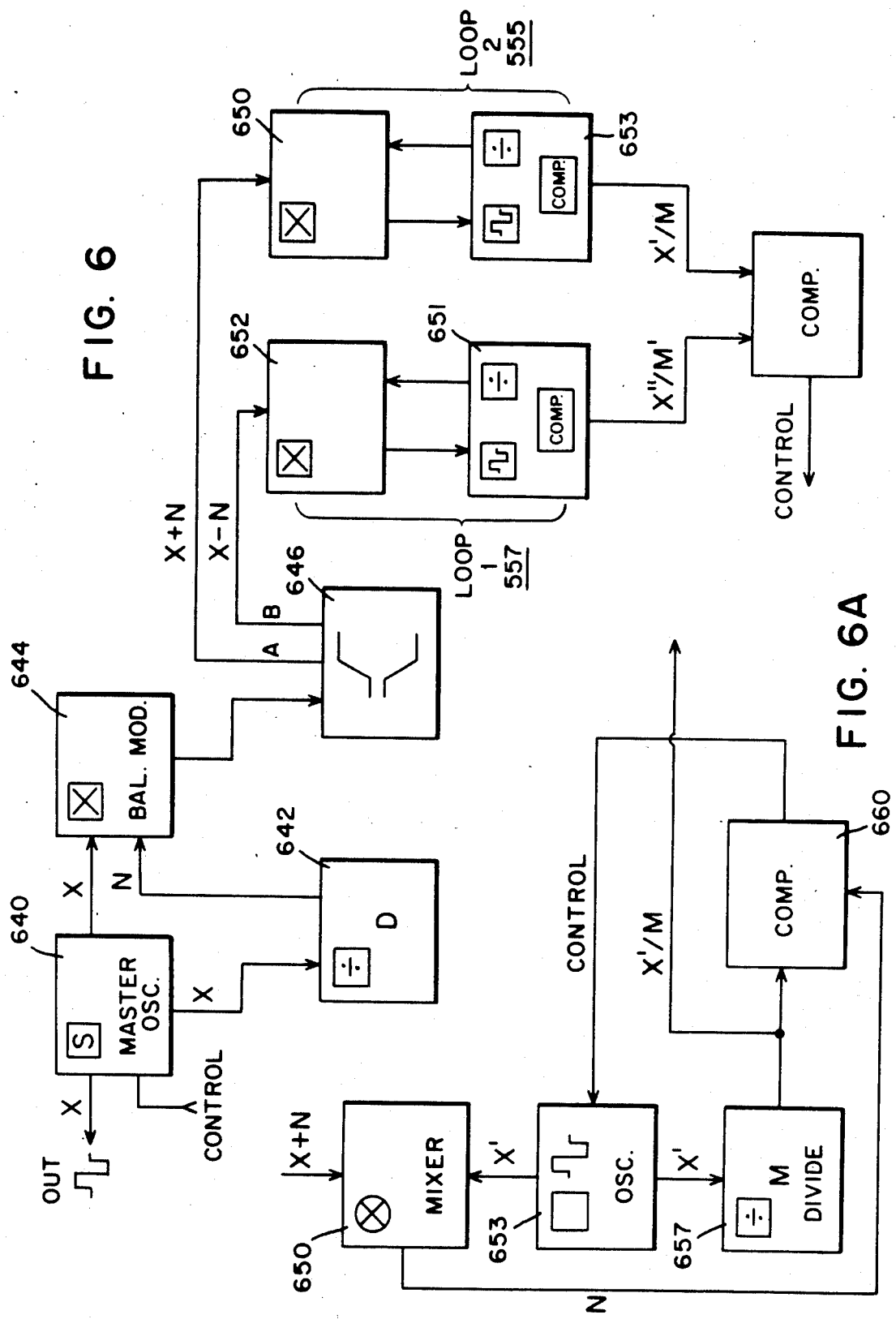

CONSTANT FREQUENCY SIGNAL GENERATOR CIRCUIT AND METHOD

BACKGROUND OF THE INVENTION

1. Field of the Invention

This invention relates generally to signal generators. More particularly, this invention relates to signal generators which generate a signal of a frequency which is essentially constant over time.

2. Related Art

There are many technical applications in which constant frequency signal generation is required. Such applications include all forms of measuring and testing equipment, as well as clocks, computer and communications systems, navigational systems, and all forms of devices in which accurate measurement of periods of time is required.

Accurate measurement of time has been a technological goal for literally hundreds of years. In the recent past, substantial improvements have been made through the use of crystal oscillators. Even more recently, atomic clocks using the rate of electron transitions in atoms of selected elements, such as cesium, rubidium and hydrogen, have been increasingly common as sources of constant frequency signals. However, both quartz oscillators and atomic clocks suffer some substantial instability caused by, for example, temperature, magnetic influences, component aging, humidity, mechanical shock, etc.

There are a wide variety of uses for accurate oscillators, that is, signal generators which provide time signals which are constant. It has been said that nearly every electronic instrument contains an oscillator of some sort, and that oscillators are as important to such instruments as are stable sources of supply voltage. See generally Horowitz and Hill, *The Art of Electronics* (1980), generally at chapters 4 and 14, and particularly at §14.09, incorporated herein by reference. Note that the various oscillators described therein range greatly in accuracy and price.

For example, temperature-compensated crystal oscillators cost about $50 and are stable to several parts per million. Ovenized crystal oscillators range in price from several hundred to more than one thousand dollars, and have stability rates of parts per million, but are noted for their tendency to degrade with age, such that the frequency varies over time. They are large in size and are costly to calibrate and maintain.

Next on the scale of complexity and price are the atomic standards: rubidium, cesium and hydrogen. These are stated to have stability of up to one part in $10^{15}$, but are priced on the order of tens of thousands of dollars ($20,000 to $30,000 is typical). These also show degradation with time.

a. Representative Crystal Oscillator

FIG. 1 shows a schematic of a conventional ovenized crystal oscillator circuit, as described in U.S. Pat. No. 4,479,096 to Fowks, which is incorporated by reference herein. It illustrates the complexity of such crystal oscillator circuits.

The oscillator circuit may be considered to comprise three main sections, namely, a crystal oscillator section 150, a buffer/amplifier section 152, and a temperature control section 154. Note that a 10 MHz crystal 156 falls between sections 150 and 154 by virtue of its electrical connection to the circuit of 150 and its physical interaction with the teperature control section 154.

In operation, a DC error signal derived from a synchronous phase detector (not shown) is applied to an RC network 158 in the feedback loop of oscillator 150, which is of the Colpitts type. Network 158 includes a gain leveling diode 160 and a variable capacitor 161, the latter being responsive to the magnitude of the DC error signal to control the fine variation in feedback capacitance and thus the fine frequency of oscillator 150. The active element of oscillator 150 is a field effect transistor (FET) 162, to which RC network 158 is connected at the gate terminal thereof.

The source of FET 162 is connected to the base of emitter follower configured transistor 164, which provides power gain to the output of FET 162 without changing its phase angle signal. This power gain without phase angle variation permits the use of greater feedback capacitance. Oscillator 150, in effect, "swamps out" temperature sensitive transistor junction capacitance variations. Also connected to the gate terminal of FET 162 is capacitor 165 in series connection with crystal 156 and capacitor network 166 which also form part of the feedback path of the oscillator.

An FET oscillator is used with a gain leveling diode as an AGC device and a bipolar emitter follower for high signal level. Frequency adjustment is obtained by way of varicap 161 and crystals having a relatively high effective series resistance can be tolerated. No tuned circuits are required. The oscillator output is derived through crystal 156 and network 166.

The oscillator output signal (OSC) is applied to buffer amplifier section 152 to increase the output level of the crystal oscillator to a useable value for driving the frequency multiplier and synthesizer (not shown), and for providing the output signal to the end user of the crystal oscillator. This has to be accomplished without permitting outside load variations to cause any significant level changes to the multiplier circuit or pulling of the crystal oscillator which cause loop control frequency perturbations.

The crystal oscillator has an output signal, OSC, at a low voltage level (approximately 200 millivolts peak to peak) and at a low output impedance. It is applied to a grounded gate FET 170 and a 100 ohm source bias resistor 168. Resistor 168 is in parallel with the equivalent source impedance of FET 170 and provides approximately a 50 ohm termination impedance to the oscillator signal. The gate of FET 170 is internally connected to the case of the transistor, thereby isolating the drain circuit. The amplified output of the oscillator signal OSC at the drain terminal of FET 170 is applied both to a coupling transformer 172 and to a high input impedance buffer/amplifier 174. The secondary winding of coupling transformer 172 provides the 10 MHz output signal to the multiplier and to the synthesizer (not shown).

The other 10 MHz output available externally to the user is capacitively coupled from the drain terminal of FET 170 to buffer/amplifier 174, the output of which is current limited by a resistor 175 and then applied to the primary winding of a coupling transformer 176. The secondary winding of transformer 176 provides the 10 MHz output signal to an externally accessible plug 178. In addition to providing isolation to variation in the load impedance to which plug 178 is connected, coupling transformer 176 also inhibits potential ground loops.

Temperature control section 154 includes an oven 180 in which 10 MHz crystal 156 is located for temperature control, preferably at the crystal tuning point for optimum stability. Heating is achieved by passing current through a 27 ohm, 3 watt wire wound resistor 182, which is in the emitter circuit of transistor 184. The temperature is monitored by thermistor 186, which is connected to a positive input terminal to amplifier 188, the output of which is connected to the base terminal of transistor 184. Thus, heating resistor 182, transistor 184, thermistor 186 and amplifier 188 form a feedback control loop for controlling the temperature within oven 180 for precise stability of oscillator 122.

The technical complexity needed to achieve relatively stable output from a crystal oscillator can now be appreciated. Obviously, such a complex circuit is difficult and expensive to build and maintain, and is of a large size and has considerable power requirements.

b. Representative Atomic Clock

FIG. 2 shows a block diagram of a conventional atomic clock as described in U.S. Pat. No. 4,290,030 to Wang, incorporated by reference herein. This illustrates dramatically the complexity of atomic clocks.

A voltage controlled crystal oscillator (VCXO) 200 having a nominal output frequency of 5 megahertz has output terminals 200a, 200b and a voltage control input 200c. The voltage present on the voltage control input 200c controls the frequency of the output produced on outputs 200a, 200b in a manner well known to those skilled in the art.

A frequency synthesizer 205 is provided and has its input 205a connected to VCXO output 200b. The synthesizer 205 multiplies the nominal 5 megahertz output of the VCXO 200 to a nominal value of 1.4 gigahertz. The synthesizer 205 outputs the 1.4 gigahertz signal at its outputs 205b, 205c. A frequency synthesizer 210 has its input 210a connected to VCXO output 200b. The frequency synthesizer 210 generates a 20.405751 megahertz signal phase locked to the VCXO 200.

The signal from the frequency synthesizer 210 passes through output 210b through a normally open electronic gate 215. A mixer 220 receives the 1.4 gigahertz signal from the frequency 205 through its input 220a, and receives the 20.4 megahertz signal from the gate 215 through its input 220b. The frequency sum of the 1.4 gigahertz signal and the 20.4 megahertz signal appears on output 220c of the mixer 220. Therefore, the signal appearing on the output 220c of the mixer 220 contains a nominal frequency of 1.420405751 gigahertz.

The maser cavity 225 includes an atom storage bulb 230, shown in simplified schematic form only. The storage bulb 230 contains hydrogen gas. An atomic beam source 245, well known in the conventional art, supplies the hydrogen gas to the storage bulb 230 through atomic beam entrance 250. The atomic beam source 245 preferably includes a static magnetic field source surrounding the atomic beam which selects hydrogen atoms having a particular magnetic spin orientation in a manner well known in the art.

The maser cavity 225 is defined by a conductive enclosure, typically a copper coating. The maser cavity 225 has an input 225a connected to the output 220c of the mixer 220. The 1.420405751 gigahertz signal from the mixer output 220c passes through the maser input 225a and is introduced into the maser cavity. The maser cavity 225 also has an output 225b through which the signal from the maser can be coupled out.

Another mixer 235 has its input 235a connected to the maser output 225b. Input 235b to the mixer 235 is connected to output 205b of frequency synthesizer 205. The mixer 235 mixes the signal from maser output 225b with the 1.4 gigahertz signal from frequency synthesizer output 205b. An amplifier 240 having a tuned output receives the resulting mixed signal from mixer 235. The frequency difference between the 1.4 gigahertz signal of frequency synthesizer output 205b and the maser signal from maser output 205b is outputted by the tuned amplifier at output 240a. The tuned amplifer 240a is tuned to pass the frequency difference signal in the mixer 235.

The signal from tuned amplifier output 240a passes through a normally closed electronic gate 255 into mixer input 260a of mixer 260. A frequency synthesizer 265 is provided, which has its input 265a connected to VCXO output 200b. The frequency synthesizer 265 multiplies the nominal 5 megahertz output signal of the VCXO 200 to 20.4 megahertz, and outputs this signal on frequency multiplier output 265b. Mixer 260 receives the 20.4 megahertz signal from synthesizer output 265b through mixer input 260b. The signal corresponding to the difference frequency of the inputs at 260a and 260b of the mixer 260 is fed to the tuned amplifier 270. The output signal R at tuned amplifier output 270a represents the frequency difference between the signal from the maser output 225b and a nominal frequency of 1.4204 Ghz.

Signal R, on tuned amplifier output 270a, is utilized to generate a corrective feedback signal sent to voltage control input 200c as follows. A presettable up-down counter 275, which has its clock timing input 275b connected to a frequency synthesizer 280, is provided. The frequency synthesizer 280 is connected to VCO output 200b and multiplies the nominal 5 megahertz output of the VCO to 100 megahertz. The 100 megahertz signal from frequency synthesizer 280 enters the timing control input 275b as a time base clock signal for the up-down counter 275.

The up-down counter 275 operates to count the number of 100 megahertz pulses received from the frequency synthesizer 280 between a preselected number of zero crossings 281 of the difference signal from tuned amplifier output 270a. The residue accumulated in up-down counter 275 is sent as digital data to digital-to-analog converter 290. The digital-to-analog converter 290 preferably has a high resolution, such as 20 bits, and an analog output range to match the voltage tuning range of the VCXO, typically between 0 and 10 volts. The digital-to-analog converter 290 converts each accumulated count into a corresponding voltage level. This voltage level is then furnished to VCO voltage control input 200c. It is now apparent that the system illustrated in FIG. 2 includes a closed feedback control loop comprising the voltage control oscillator 200, the synthesizer 205, the maser 225, the mixer 235, the mixer 260, and the synthesizer 280 generating the time base clock signal for the up-down counter 275.

Logic control circuitry is provided which temporarily deactivates operation of this feedback control loop whenever the maser 225 is externally stimulated, in accordance with the free induction technique. A pulse generator 300 generates a clock signal controlling electronic gates 215 and 255. Pulse generator 300 also transmits the clock signal to input 305a of control logic device 305. The control logic device 305 also receives the output difference signal of from tuned amplifier output 270a through input 305b.

Initially, the VCXO 200 outputs a 5 megahertz signal at output 200b. Frequency synthesizer 205 multiplies this signal to 1.4 gigahertz and introduces it into mixer 220. The electronic gate 215 is normally open, and therefore the mixer 220 normally receives only a 1.4 gigahertz input signal. This signal is not transmitted by the maser cavity 225 since it is far from the cavity resonance frequency. In any case, the 1.4 gigahertz signal is not sufficiently close to $f_0$, the ground state hyperfine transition frequency of 1.42040575168 gigahertz, to stimulate the hyperfine transition in the hydrogen gas. Consequently, there is no emission from the hydrogen gas inside maser cavity 225.

Later, the clock signal is pulsed positively. Therefore, electronic gate 215 is then closed, thereby allowing the 20.405751 megahertz signal from frequency synthesizer 210 to enter mixer input 220b. Also, at time $T_1$, gate 255 is opened, which isolates the feedback loop. Mixer 220 causes the frequency sum of the 1.4 gigahertz signal from frequency synthesizer 205 and the 20.405751 megahertz signal from frequency synthesizer 210 to enter the maser cavity 225 through maser input 225a as a nominal 1.420405751 gigahertz signal.

The resulting 1.420405751 gigahertz stimulation signal has a frequency bandwidth determined by the pulse width and, therefore, contains a frequency component at the exact frequency $f_0$ of the hyperfine transition of the hydrogen gas. Therefore, the hydrogen atoms inside the storage bulb 230 start to radiate as a result of the introduction of the stimulating signal returning to zero amplitude; the electronic gate 215 opens while gate 255 closes, thereby permitting the output of the maser to reach the feedback loop.

Therefore, the frequency of the output signal on mixer output 220c introduced into maser input 225a returns to the nominal 1.4 gigahertz frequency, which as discussed above, is not sufficiently close to the transition frequency $f_0$ of the hydrogen gas inside the storage bulb 230. The hydrogen gas therefore is no longer excited by the signal from mixer output 220c. However, the stimulating pulse succeeded in creating a population of radiating hydrogen atoms in the storage bulb 230, and these atoms radiate energy at the hyperfine transition frequency. The radiation from the hydrogen atoms in the storage bulb 230 resonates inside the cavity 225 so that the signal at maser output 225b has a frequency equal to the hyperfine transition frequency $f_0$. The resulting exponential decay of the maser output causes exponential decay of the difference output. The resonance of the stimulation signal in the cavity 225 decreases so rapidly that it has a decay envelope which is not significant.

The 1.4 gigahertz signal from synthesizer 205 is fed into mixer 235, where it is substracted from the maser output signal frequency $f_0$, and the difference frequency then appears on tuned amplifier output 240a. The output from mixer 235 is subtracted in mixer 260 from the 20.4 megahertz signal generated by synthesizer 265, the difference of which appears on tuned amplifier 270a. If it is assumed that the VCXO 200 is generating a signal at the precise frequency of 5 megahertz, it is seen that the signal on maser output 225b, which has the frequency of 1.42040575168 gigahertz, is subtracted from the 1.4 gigahertz signal in mixer 235 and the resulting signal is then subtracted from the 20.4 megahertz signal in mixer 260. The resulting response appears at tuned amplifier output 270a and has a relatively low frequency of 5.75168 kilohertz.

The resonance signal decays exponentially as soon as the stimulative signal is turned off. Processing of the resonance signal occurs while there is no external stimulation. After the signal has decayed to zero, a new stimulation pulse occurs, and the entire foregoing sequence is repeated. The stimulation pulses are repeated at selected intervals throughout the entire operation of the invention, and each stimulation signal is followed by a new response signal which in turn must be processed by the control logic 305.

Processing of each response signal from tuned amplifier output 270 will now be described. The counter control logic 305 receives the clock pulse signal from pulse generator 300. Counter control logic 305 receives the response signal from tuned amplifier output 270 through the input 305b. The control logic 305 senses each zero crossing 281 of the response signal. As soon as the first zero crossing 281 is sensed, the control logic 305 enables the up down counter 275, and therefore, the up down counter 275 begins to accumulate counts of 100 megahertz pulses received from the synthesizer 280. The control logic 305 may be preset to a certain value, which, for example, may be equal to 1,000, so that as soon as the control logic 303 has sensed 1,000 zero crossings 281 in the response signal, the control logic 305 disables up down counter 275 so that the counter 275 stops counting.

Thus, it is seen that the operation of the control logic 305 causes the updown counter 275 to count the number of 100 megahertz pulses from synthesizer 280 which occurs during an interval defined by 1,000 zero crossings of the response signal. It is apparent that if the oscillator 200 is precisely adjusted such that the frequency of the response signal is precisely 575.1680 hertz, it will take precisely 0.17386225 seconds for the 1,000 zero crossings to occur. Therefore, in this exemplary situation, counter 275 will be enabled for exactly 0.17386225 seconds, and will count precisely 17,386,225 pulses from 100 megahertz synthesizer 280.

OBJECTS OF THE INVENTION

It is an object of the present invention to provide an improved constant frequency signal generator.

It is another object of the present invention to provide a constant frequency signal generator in which no elaborate compensation arrangements are required due to the inherent self-regulating nature of the signal generation circuit.

It is a further object of the present invention to provide a constant frequency signal generator which is technically simpler, less expensive, and more reliable and accurate than those of conventional technology.

It is a further object of the present invention to provide a source of frequency that does not significantly degrade in stability over time.

Those and other objects are achieved by the present invention discussed below.

SUMMARY OF THE INVENTION

The present invention satisfies many needs of the art and the objects of the invention described above by provision of a self-regulating signal generator circuit having a constant frequency output signal.

The basic concept of the present invention is of providing an output signal having a preselected frequency value X, a main feedback loop, a first feedback loop, and a second feedback loop. Deviation of the ouput signal from the preselected frequency value X causes the second feedback loop to be responsive at twice the frequency rate as that of the first feedback loop. The frequency difference between the values of the first feedback loop and the second feedback loop (that is, the frequency difference between the offset component of the first divided signal and the offset component of the second divided signal) is used to produce a control signal for the main feedback loop used to control the frequency value X of the output signal. In this way, the circuit of the present invention is made self-correcting. Elaborate temperature compensation or the like is not required to ensure a stable frequency source. Both short and long term stability of a high order is obtained.

In a first embodiment, the first feedback loop comprises a first mixer which mixes the master oscillator X signal with a X+N signal generated by a first local oscillator. The difference N signal is supplied to the first input of a first comparator. The X+N signal from the first local oscillator is divided by a value A to produce a first divided (X+N)/A signal which is supplied to the second input of the first comparator. The output signal from the first comparator (which has a zero value if the frequency X+N of the first local oscillator is correctly related to the master X signal) is fed back to the first local oscillator to control its frequency X+N.

The second feedback loop of the first embodiment includes a multiplier which multiplies the X signal from the master oscillator by a value B. The XB signal thus produced is supplied to a second mixer which mixes it with a XB−D signal generated by a second local oscillator. The difference D signal from the second mixer is supplied to the first input of a second comparator. The XB−D signal is divided by a value E to produce a second divided (XB−D)/E signal, which is supplied to the second input of the second comparator. The output signal from the second comparator (which has a zero value if the XB−D frequency of the second local oscillator is correctly related to the master X signal) is fed back to the second local oscillator to control its frequency XB−D.

The master loop of the first embodiment includes a master or third comparator having a first input provided with the first divided (X+N)/A signal from the first feedback loop, and having a second input provided with the second divided (XB−D)/E signal from the second feedback loop. Note that the second feedback loop is responsive at twice the frequency as that of the first feedback loop. The control signal at the output of the master comparator, which has a value indicative of the frequency difference between the first divided (X+N)/A signal and the second divided (XB−D)/E signal, is used to control the frequency value X of the output signal from the master oscillator.

Turning now to the second embodiment of the present invention, a master oscillator generates an output signal of a preselected frequency X, which is supplied to a first input of a balanced modulator. The X signal is also supplied to a master divider which divides it by D to produce a N signal. The N signal is supplied to the second input of the balanced modulator, which produces a sum X+N signal and a difference X−N signal.

The first feedback loop of the second embodiment includes a first mixer which mixes the X−N signal with a X' signal generated by a first local oscillator. The difference N signal from the first mixer is supplied to the first input of a first comparator. The X' signal also is divided by a value M to produce a first divided X'/M signal which is supplied to the second input of the first comparator. The output signal from the first comparator (which has a zero value if the frequency X' of the first local oscillator is correctly related to the master X signal) is fed back to the first local oscillator to control its frequency X'.

The second feedback loop of the second embodiment includes a second mixer which mixes the X+N signal with a X" signal generated by a second local oscillator. The difference N signal from the second local oscillator is divided by a value M to produce a second divided X"/M signal which is supplied to the second input of the second comparator. The output signal of the second comparator (which has a zero value if the frequency X" of the second local oscillator is correctly related to the master X signal) is fed back to the second local oscillator to control its frequency X".

The master loop of the second embodiment includes a master or third comparator having a first input provided with the first divided X'/M signal from the first feedback loop, and having a second input provided with the second divided X"/M signal from the second feedback loop. Note that the second feedback loop is responsive at twice the frequency as that of the first feedback loop. The control signal at the output of the master comparator, which has a value indicative of the frequency difference between the first divided X'/M signal and the second divided X"/M signal, is used to control the frequency value X of the output signal from the master oscillator.

Consequently, the output signal from the master oscillator is of a very precise frequency that does not vary over time, temperature, or humidity.

BRIEF DESCRIPTION OF THE DRAWINGS

The invention will be better understood if reference is made to the accompanying drawings, in which:

FIG. 6 is a block diagram of a second embodiment of the present invention using a balanced modulation approach;

FIG. 6A is a block diagram of a representative implementation of the first feedback loop or the second feedback loop of FIG. 6.

DESCRIPTION OF THE PREFERRED EMBODIMENTS

The conventional art discussed above illustrates that there exists a significant need for an oscillator which is simple, accurate and inexpensive. The present invention satisfies these goals by provision of an oscillator which does not require expedients such as temperature compensation or the like to ensure accuracy, but which instead relies on its inherent design to provide a very stable source of oscillation. Note that throughout this section of the application exemplary values for frequency are given. However, this is merely for purposes of illustration, and these frequencies and the ratios between them should not be construed to limit the present invention.

Speaking broadly, the constant frequency oscillator of the present invention is realized by a circuit including a controllable master oscillator which outputs a signal precisely at the desired frequency.

1. First Embodiment

Figure 1:
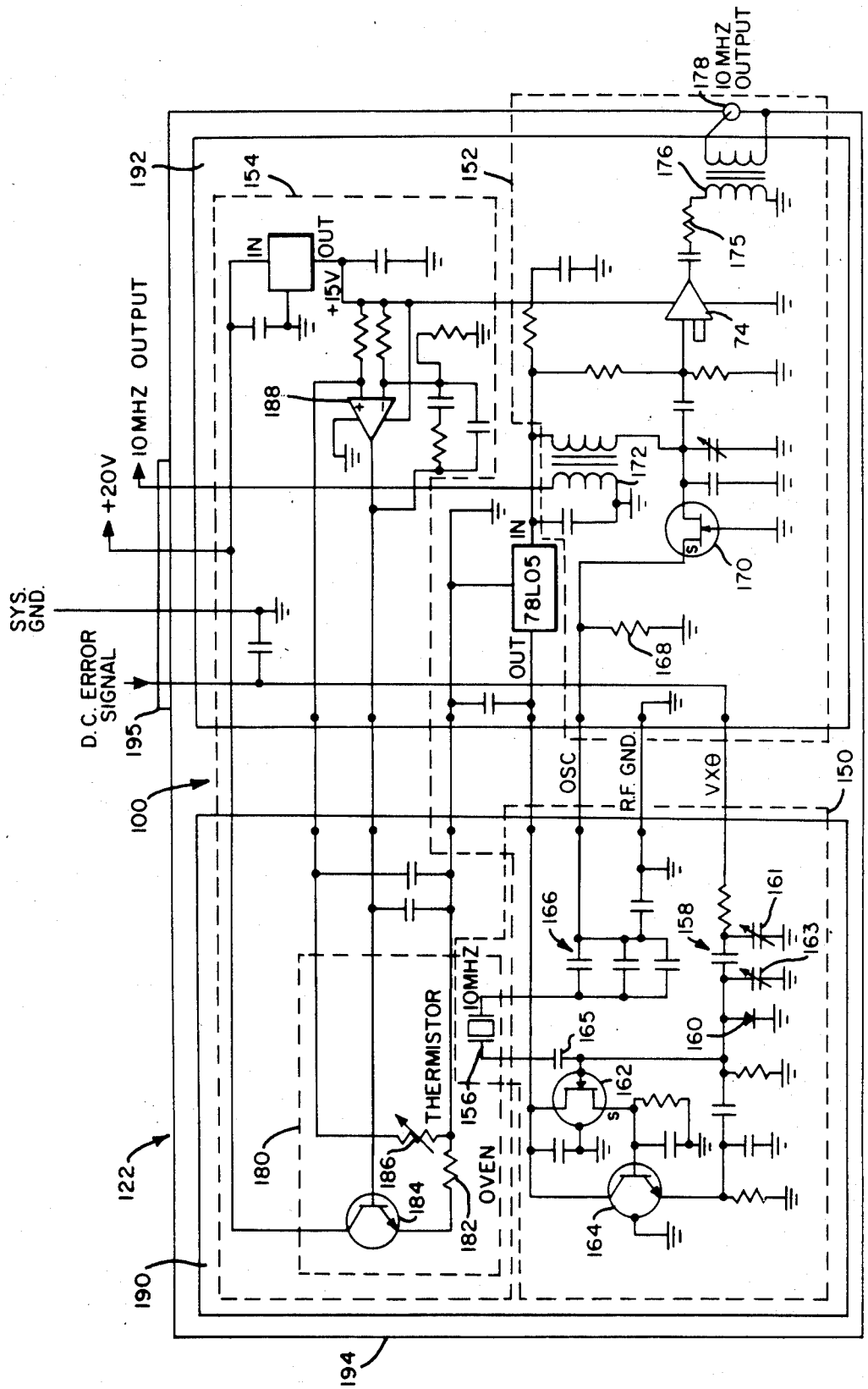
FIG. 1 shows a schematic diagram of a conventional quartz crystal oscillator system.
Figure 2:
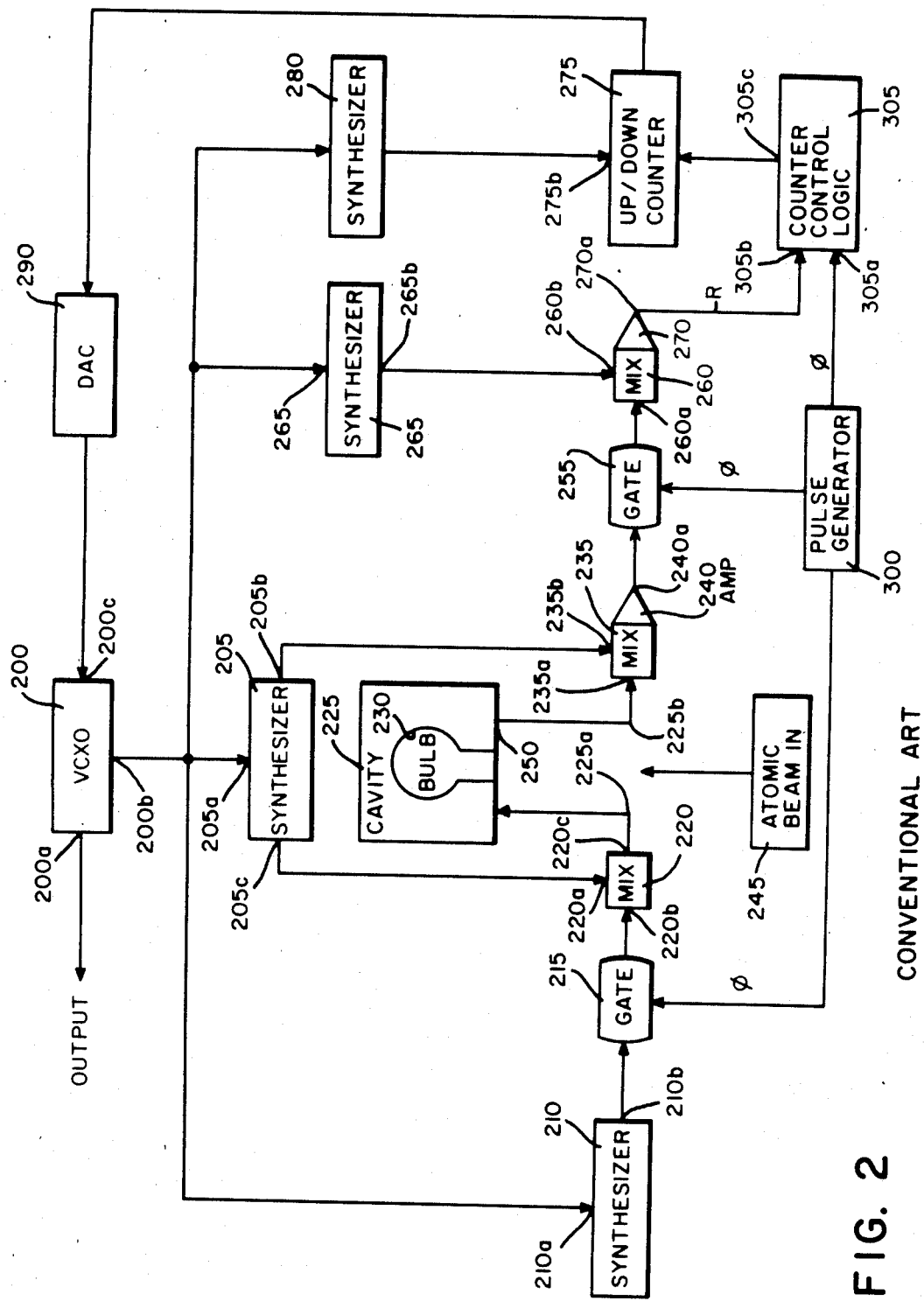
FIG. 2 shows a block diagram of a conventional atomic clock system.
Figure 3A:
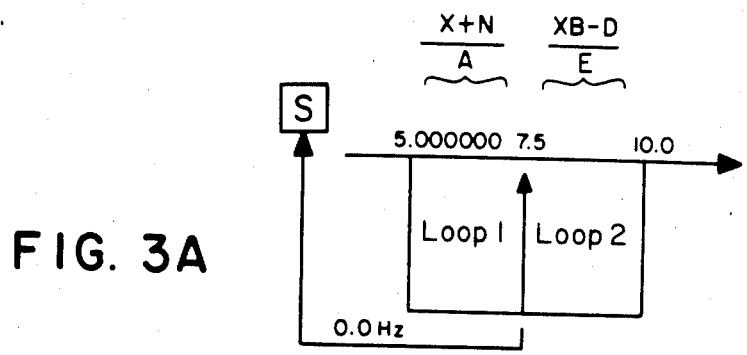
FIGS. 3A to 3D illustrate the operation of the first embodiment of the present invention.
Figure 3B:
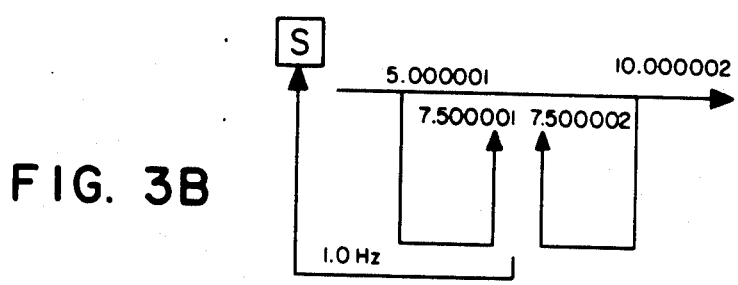
Figure 3C:
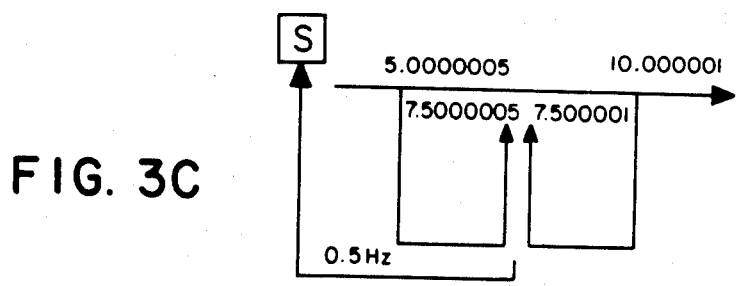
Figure 3D:
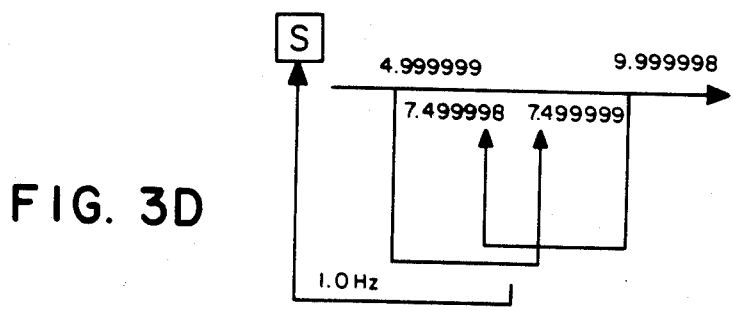
Figure 4:
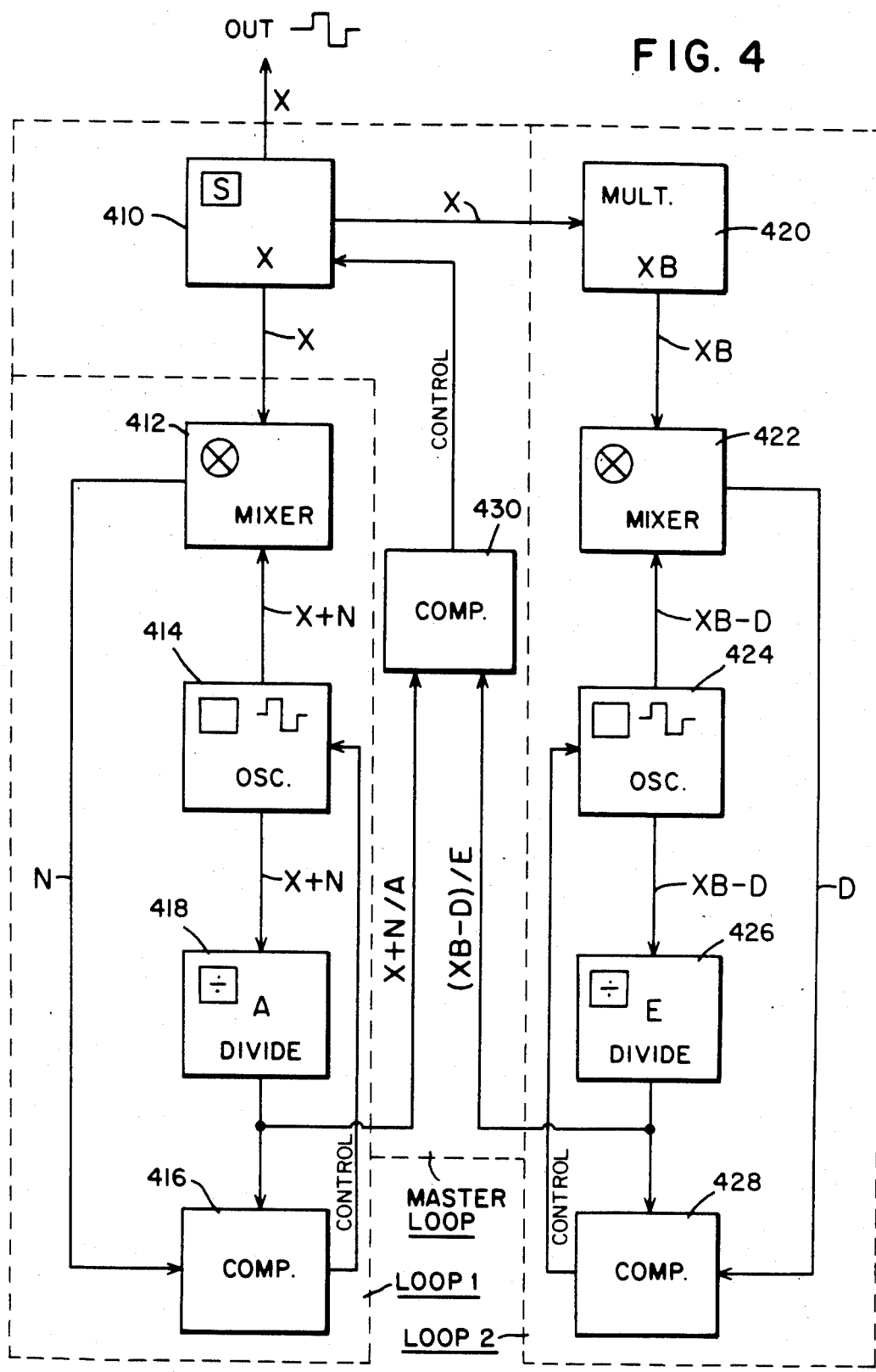
FIG. 4 is a block diagram of a first embodiment of the present invention using algebraic notation.
Figure 5:
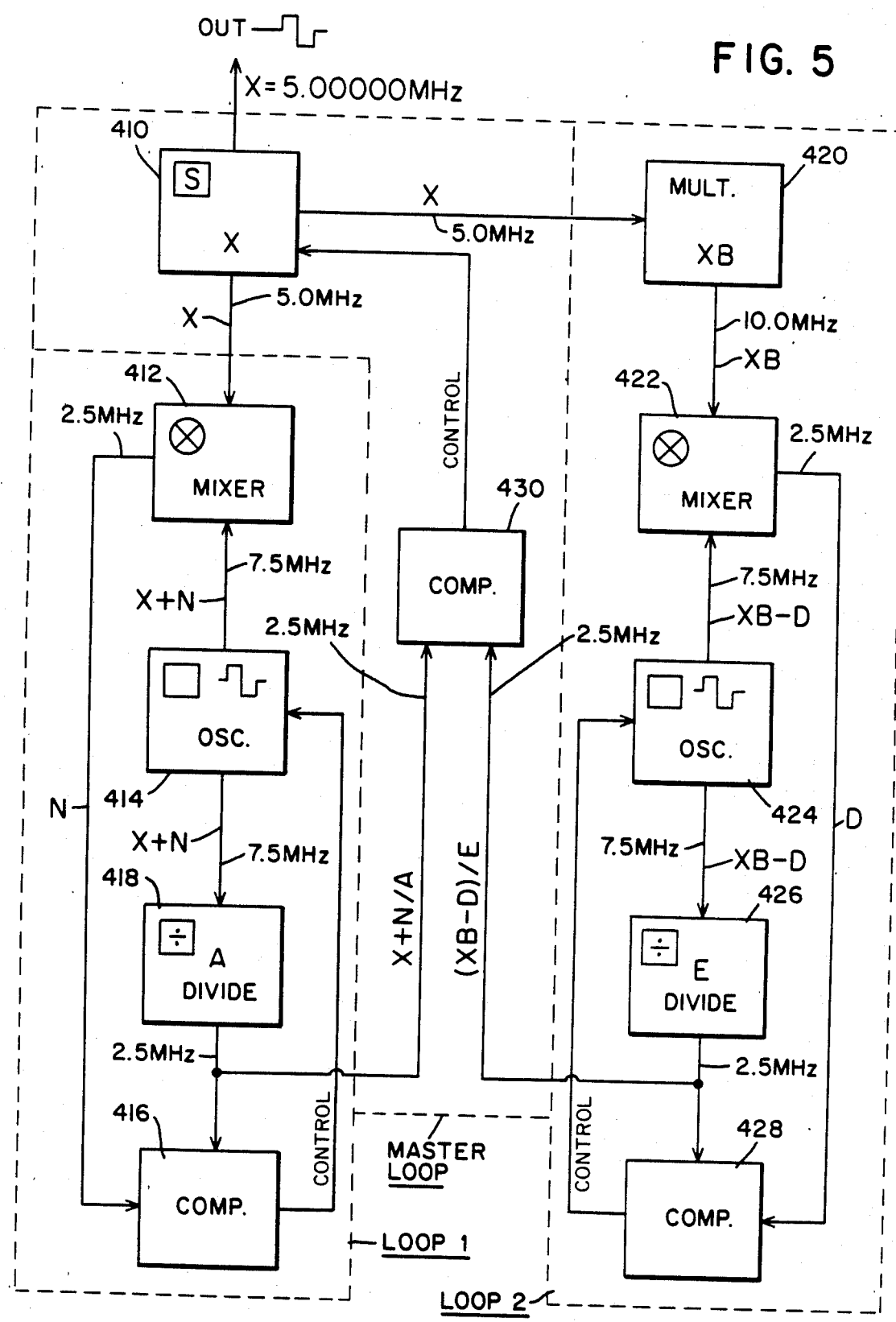
FIG. 5 is a block diagram with representative frequency values of the first embodiment of the present invention.

A block diagram of a first embodiment of the present invention is shown in FIG. 4. It gives values for the frequencies of the various signals in the circuit in algebraic form. The user can cause the master oscillator 410 to generate an output signal of a selected frequency X by using the values specified by the algebraic equations in the three loops of the present invention. The output X of the master oscillator 410 is locked down to the desired output frequency even though the local oscillators 414 and 424 of themselves are not that stable. FIG. 5, discussed below, gives examples of these frequencies for a specific example of this embodiment of the present invention. FIGS. 3A to 3D illustrate the operation of this representative example of the first embodiment of this representative example of the first embodiment of the present invention.

In the circuit of FIG. 4, master oscillator 410 generates the output signal of very precise frequency X for the circuit of the present invention. This output signal has a frequency of X, which is selected by the user. In a mixer 412, the signal of frequency X from master oscillator 410 is mixed with a signal of frequency $X+N$ generated by a local oscillator 414. The output of mixer 412, which is a signal of difference frequency N, is supplied to a first input of a comparator 416. A second input of comparator 416 is supplied with the signal at the output of a divider network 418, which divides the signal of frequency $X+N$ at the output signal of local oscillator 414 by an interger number A, such that $(X+N)/A=N$ when the nominal frequency $X+N$ of local oscillator 414 is correct. The output of comparator 416 is zero if the frequency of local oscillator 414 is correctly related to the signal of frequency X. The output of comparator 416, indicative of the frequency error between the output of master oscillator 410 and local oscillator 414, is fed back to local oscillator 414 for frequency control, thus completing this first phase-locked-loop circuit.

Turning now to the second phase lock loop circuit, the signal of frequency X outputted by master oscillator 410 is supplied to a multiplying network 420, where it is frequency multiplied by a quantity B, which will be an integer. The signal of frequency XB from multiplying network 420 is supplied to a mixer 422. A local oscillator 424 generates a signal having a nominal frequency of $XB-D$ as is defined below, which is supplied to mixer 422. The difference frequency signal of value D at the output of mixer 422 is supplied to a first input of a comparator 428. The other input to comparator 428 is supplied with a signal of a frequency $(XB-D)/E$, which is obtained after division in a divider network 426 by a quantity E chosen such that $(XB-D)/E=D$ when the frequency of the signal $XB-D$ is correct. The output of comparator 428 is zero if the frequency of local oscillator 424 is correctly related to the signal of frequency XB. The output of comparator 428, indicative of the effective error between the multiplied output of master oscillator 410 and the local oscillator 424, is fed back to local oscillator 424 for frequency control, thus completing this second phase-locked-loop circuit.

The first input of a comparator 430 is supplied with the signal of frequency $(X+N)/A$ present at the output of divider 418 of loop 1. As illustrated in FIG. 3A, this signal $(X+N)/A$ is equal to the frequency difference between the output of local oscillator 414 and the master oscillator 410. Another way to look at this is that this signal $(X+N)/A$ is half of the numerical difference between signal X and signal XB.

The second input of comparator 430 is supplied with the signal of frequency $(XB-D)/E$ present at the output of divider 426. As shown in FIG. 3A, this signal $(XB-D)/E$ is equal to the frequency difference between the output of frequency multiplier 420 and local oscillator 424. Another way to look at this is that this signal $(XB-D)/E$ is half the numerical difference between signal X and signal XB.

The output of comparator 430 is used to control the frequency X generated by master oscillator 410. When signal $(X+N)/A$ is equal to signal $(XB-D)/E$, the output of comparator 430 is zero, indicating that the value of signal X is correct. This state of operation is shown in FIG. 3A. The operation of comparator 430 used to correct signal X is now described with reference to FIG. 5 and FIGS. 3B to 3D.

Referring now to FIG. 5 which shows representative values for the variables of the embodiment of FIG. 4, master oscillator 410, which may comprise a voltage-controlled oscillator (VCO) or a voltage-controlled crystal oscillator (VXCO), provides an output signal X at a nominal frequency of 5 MHz, which signal X is also provided to mixer 412. A first loop oscillator 414 provides a signal of nominal frequency of $X+N=7.5$ MHZ to the mixer 412. The mixer 412 frequency subtracts the 5 MHz signal X from the 7.5 MHz signal $X+N$ to produce the signal $N=2.5$ MHz.

The output N of mixer 412 therefore is a 2.5 MHz signal, which is supplied to comparator 416. The 7.5 MHz signal $X+N$ from oscillator 414 is also supplied to a divide-by-3 network 418 where $A=3$ such that it also outputs a 2.5 MHz signal $(X+N)/A$. This 2.5 MHz signal $(X+N)/A$ is compared in comparator 416 to the 2.5 MHz signal N generated by the mixer 412. The difference, termed the "control signal", is supplied to the oscillator 414, such that the desired 7.5 MHz signal $X+N$ is frequency controlled to be correct. This control signal thus provides a phase-locked loop defining a 2.5 MHz frequency $(X+N)/A$ with exactitude which in turn defines the 7.5 MHz signal $X+N$ accurately.

This proper operation of the first loop is shown in FIG. 3A. As illustrated, the value of $(X+N)/(A)=2.5$ MHz, and the value of $X+B=7.5$ MHz. The value of $X=5.0$ MHz. Note that $X+B=7.5$ MHz is exactly halfway between $X=5.0$ MHz and $XB=10.0$ MHz. Referring now to loop 2, the signal X from the master oscillator 410 also is supplied to a frequency multiplier 420, which multiplies this signal by an integer B, where $B=2$. In the case where $B=2$, a preferred embodiment for frequency multiplier 420 is shown in U.S. Pat. No. 3,681,705 to Spence, which is incorporated by reference herein in its entirety. Note that in the present example, $B=2$.

The multiplier 420 therefore provides a 10 MHz output signal XB, which is multiplied in mixer 422 with a 7.5 MHz signal $BX-D$ provided by oscillator 424. A divide-by-3 network 426 divides the 7.5 MHz signal by 3, producing an $(XB-D)/E$ signal of 2.5 MHz. This 2.5

MHz signal is supplied to comparator 428. Comparator 428 provides a "control signal" to oscillator 424 to maintain the (XB−D) value of 7.5 MHz illustrated by the diagram for loop 2 of FIG. 3A.

The two 2.5 MHz signals outputted by the loops 1 and 2 are supplied to comparator 430, which provides the control signal to the master oscillator 410, effectively defining a third or master phase locked loop. This master loop locks the value of X generated by master oscillator 410 to 5.000,000 MHz, as illustrated in FIG. 3A.

Referring now to FIG. 3B, assume that the frequency value of X moves 1 Hertz upward so that X=5.000,001 MHz. This change in X causes the value of X+N generated by oscillator 414 of loop 1 to become 7.500,001 MHz. In addition, this change in X causes the value of XB−D generated by oscillator 424 of loop 2 to become 7.500,002 MHz. Note that the value for loop 2 is twice the frequency change of loop 1. The frequency difference between XB−D and X+N is 1 Hertz, which is also the change of the value in X for which the present invention will compensate.

Referring now to FIG. 3C, the master oscillator 410 value X has been moved down 0.5 Hertz from its 5.000,000 MHz value so that it now has a X value of 5.000,000,5 MHz. This change in X causes the value of X+N generated by oscillator 414 of loop 1 to become 7.5000005 MHz. In addition, this change in X causes the value of XB−D generated by oscillator 424 of loop 2 to become 7.500,001 MHz. Note that the value for loop 2 is twice the frequency change of loop 1. The frequency difference between XB−D and X+N is 0.5 Hertz, which is also the change in the value in X that has not yet been compensation.

FIG. 3A shows the completion of the correction process that has been occuring in FIGS. 3B and 3C. Note that the value of X+N now equals to value of XB−D. This is the "locked up" state of the present invention. Since loop 2 moves twice as fast frequency wise as loop 1, the present invention can compensate for unwanted changes in X and maintain X at a very precise frequency value both with respect to short and long term time periods. Note that long term stability is indicated by the mathematics, while short term stability is determined by the slew rate of the three loops. Integration (not shown) can be added to each of the three loops to effectively control the amount of short term instability.

FIG. 3D shows the condition when the value of X from the master oscillator goes 1 Hertz below the desired value such that X=4.999,999 MHz. Note that the value for XB−D has moved twice as fast as the value for X+N so that $XB-D=7.499,998$ MHz and $X+N=7.499,999$ MHz, a value which is now greater than XB−D as opposed to being less as was the case in Figures 3B and 3C. The correction process back to X=5.000,000 MHz is the same as described above with loop 2 moving twice as fast frequency wise as loop 1 towards the desired "locked in" condition.

2. The Second Embodiment

A second embodiment of the present invention is shown in block diagram form in FIG. 6. FIG. 6 also includes FIG. 6A, which shows in greater detail an embodiment of one of the two phase locked loop circuits 555,557 shown in FIG. 6. The principle of operation of the embodiment of FIG. 6 is somewhat similar to that of FIG. 4.

Referring now to FIG. 6, a master oscillator 640 outputs a signal having a nominal frequency of X. This signal X is supplied to a balanced modulator 644, where it is summed and differenced with a mixing signal N from a divider 642. Divider 642 receives the signal X from master oscillator 640 and divides it by D to produce the mixing signal N.

The outputs of the balanced modulator 644, which are sum and difference signals having frequencies X+N and X−N, respectively, are supplied to upper bandpass filter 646A and lower bandpass filter 646B, respectively, of bandpass filter state 646. The sum signal X+N at the output of bandpass filter 646A is supplied to phase locked loop 2. The difference signal of frequency X−N at the output of bandpass filter 646B is supplied to phase locked loop 1.

Referring now to loop 2 and to the embodiment shown in FIG. 6A, signal X+N is mixed with signal X' generated by a voltage controlled oscillator (VCO) or voltage controlled crystal oscillator 556. When the frequency of X'=X—which means that master oscillator 640 is "locked" to the desired value of X—the difference signal from mixer 650 has a value of N. The output X' of local oscillator 653 is also supplied to a divider 657, which frequency divides the signal by M to produce a signal of X'/M. The signal N is frequency compared with the signal X'/M to produce a control signal supplied to VCO 653 to control the value of X'. The value of the control signal is zero when $N=X'/M$.

Referring now to loop 1, signal X−N is mixed with a signal X'' generated by a local oscillator (not shown). The operation of loop 1 is similar to that of loop 2, except that loop 2 moves at a frequency rate that is twice the rate of loop 1. Note that loop 1 can utilize the approach shown in the embodiment of FIG. 6A. Loop 1 provides a signal X''/M'.

The signal X'/M from loop 2 is supplied to a first input of a comparator 662. The signal X''/M' from loop 1 is supplied to a second input of comparator 652. The value at the control output of comparator 662 is indicative of the frequency amount that X is from its desired value. This control signal is fed back to the control input of master oscillator 640.

Figure 7A:
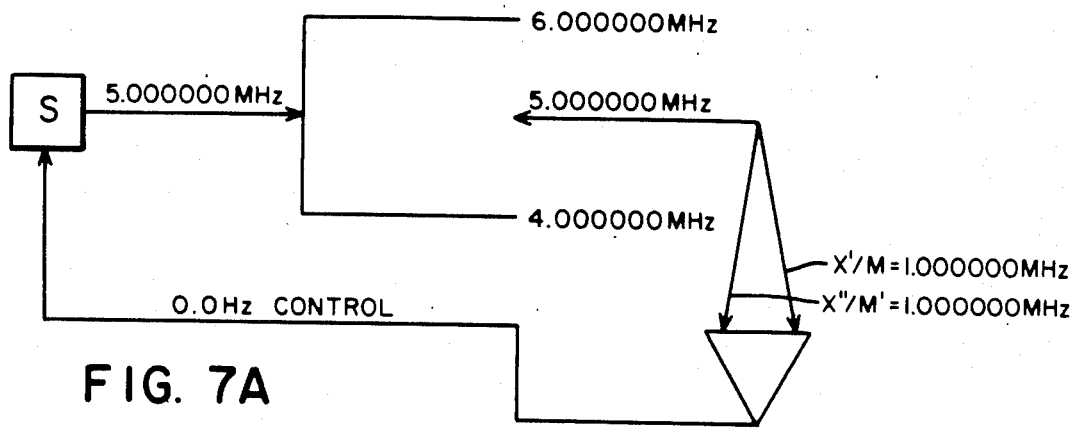
FIGS. 7A to 7C illustrate the operation of the second embodiment of the present invention.
Figure 7B:
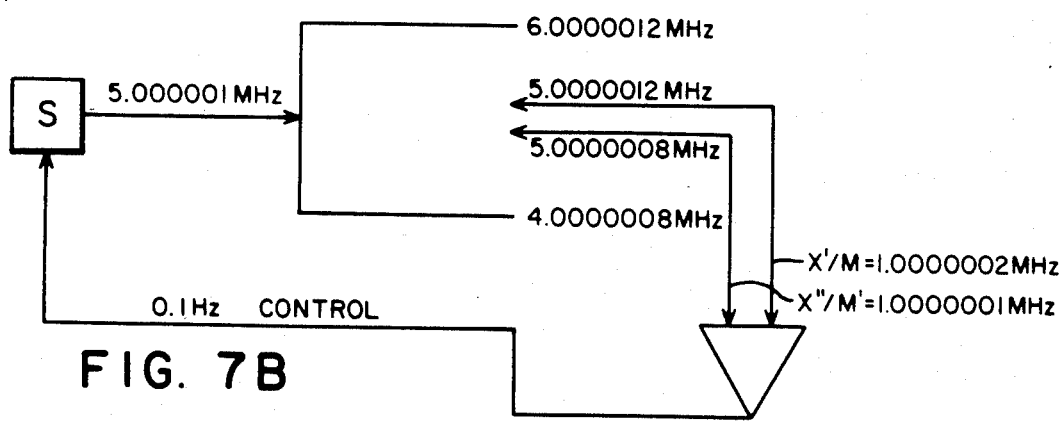
Figure 7C:
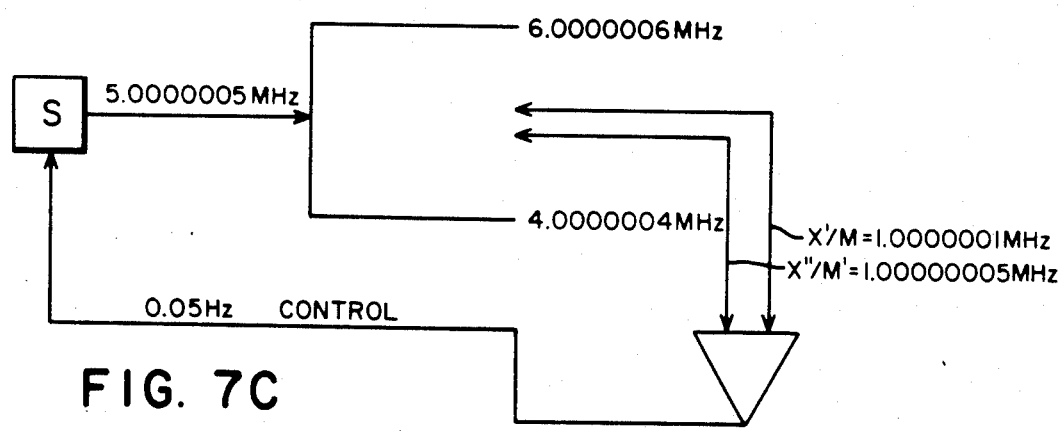

Referring now to FIGS. 7A–7C, the operation of a specific implementation of the second embodiment of the present invention is illustrated. Assume for purposes of discussion that X=5.000,000 MHz, N=1.000,000 MHz, $X+N=6.000,000$ MHz, $X-N=4.000,000$ MHz, $X'/M=1.000,000$ MHz, and $X''/M'=1.000,000$ MHz. This "locked in" condition is shown in FIG. 7A, causing a control signal on the master loop for controlling master oscillator 640 to be indicative of no frequency change.

Suppose for purposes of explanation that the value of X from master oscillator 640 changes by 1 Hz so that X=5.000,001 MHz. As shown in FIG. 7B, this causes the signal $X+N=6.000,001,2$ MHz, and the signal $X-N=4.000,008$ MHz. Loop 2 thus produces a value for $X'/M=1.000,002$ MHz. Similarly, loop 1 produces a value for $X''/M'=1.000001$ MHz. The value of the control signal from comparator 662 is 0.1 Hz, which causes the frequency value of X to start moving back to the desired X=5.000,000 MHz.

FIG. 7C illustrates the correction process half way between the deviation of FIG. 7B and the desired "locked in" condition of FIG. 7A. As shown, the frequency value of the output of master oscillator 640 is X=5.000,005 MHz, thus producing a control signal having a value of 0.05 Hz. The correction continues until the locked in condition of FIG. 7A is again attained.

Note that loop 2 moves at twice the frequency rate of loop 1. Also note that the value of $X'/M < X''/M'$ when X is less than the desired "locked in" value. This means that the embodiment exhibits a very high degree of control over the value of X from master oscillator 640 both with respect to short and long term time periods. Note that long term stability is indicated by the mathematics, while short term stability is determined by the slew rate of the three loops. Integration (not shown) can be added to each of the three loops to effectively control the amount of short term instability.

2. Conclusion

It will be appreciated that there has been described a novel constant frequency generator which may be implemented in a number of different ways. The basic concept of the present invention is of providing a nominal frequency, a main feedback loop, and first and second feedback loops. Deviation from the nominal frequency causes the second feedback loop to be responsive at twice the frequency rate as that of the first feedback loop. The frequency difference between the values of the first feedback loop and the second feedback loop is used to produce a control signal for the main feedback loop used to control the nominal frequency. In this way, the circuit of the present invention is made self-correcting; elaborate temperature compensation or the like is not required to ensure a stable frequency source. Both short and long term stability of a high order is obtained.

Two preferred embodiments of the present invention have been described. The present invention should not be limited thereby, but only by the following claims.

I claim:

1. A signal generator, which comprises:
   (a) master oscillator means for generating an output signal having a preselected frequency value X;
   (b) first loop means connected to said master oscillator means, and having a first local oscillator means, for generating in response to said output signal a first comparator signal having a first value indicative of the frequency deviation of said output signal from said preselected frequency value X;
   (c) second loop means, connected to said master oscillation means, and having a second local oscillator means, for generating in response to said output signal a second comparator signal having a second value indicative of the frequency deviation of said output signal from said preselected frequency value X, said second value having an offset component which is twice the offset component of said first value for a given frequency deviation of said output signal from said preselected frequency value X; and
   (d) master loop means, connected to said master oscillator means, first loop means and second loop means, for producing a master control signal in accordance with the difference between said offset component of first comparator signal and said offset component of said second comparator signal, said master control signal being supplied to said master control means to cause said output signal to be changed to have said preselected frequency value X.

2. The signal generator of claim 1, wherein said master oscillator means comprises a voltage control oscillator.

3. The signal generator of claim 1, wherein said master oscillator means comprises a voltage crystal controlled oscillator.

4. The signal generator of claim 1, wherein said first loop means comprises first mixer means responsive to said output signal and to first local oscillator signal from said first local oscillator means to produce a first difference frequency signal, divider means connected to said first local oscillator means for dividing said first local oscillator signal by a preselected amount to produce a first divided local oscillator signal, and first comparator means responsive to said first difference frequency signal and said first comparator signal to produce a control signal for controlling the frequency of said first local oscillator signal generated by said first local oscillator means.

5. The signal generator of claim 4, wherein said second loop means comprises second mixer means responsive to said output signal and to a first local oscillator signal from said second local oscillator means to produce a second difference frequency signal, divider means connected to said second local oscillator means for dividing said second local oscillator signal by a preselected amount to produce a second comparator signal, and second comparator means responsive to said second difference frequency signal and said second comparator signal to produce a control signal for controlling the frequency of said second local oscillator signal generated by said local oscillator means.

6. The signal generator of claim 5, wherein said master loop means comprises master comparator means responsive to said first comparator signal and said second comparator signal for producing said master control signal.

7. The signal generator of claim 1, wherein said second loop means comprises multiplier means responsive to said output signal for producing a multiplied signal, second mixer means connected to said multiplied signal of said multiplier means and responsive to a second local oscillator signal from said local oscillator means to produce a second difference frequency signal, divider means connected to said second local oscillator means for dividing said second local oscillator signal by a preselected amount to produce said second comparator signal, and second comparator means responsive to said second difference frequency signal and said second comparator signal to produce a control signal for controlling the frequency of said second local oscillator signal generated by said second local oscillator means.

8. The signal generator of claim 1, wherein said master oscillator means comprises a master oscillator for producing said output signal of preselected frequency X, master divider means connected to said master oscillator for dividing said output signal by a preselected amount D to produce a first signal of frequency N, balanced modulation means connected to said master oscillator and said master divider for mixing said first signal and said output signal to produce a sum signal of frequency $X+N$ and a difference signal of frequency $X-N$, and means for supplying said difference signal of frequency $X-N$ to said first feedback loop means and for supplying said sum signal of frequency $X+N$ to said second feedback loop means.

9. A signal generator, which comprises:
   (a) master loop means comprising:

(1) master oscillator means for generating an output signal having a preselected frequency value X; and (2) master comparator means for providing a control signal to said master oscillator means for controlling the frequency of said output signal, said control signal responsive to the frequency difference between a first divided signal and a second divided signal;

(b) first feedback loop means comprising:
  (1) first local oscillator means for generating a first local oscillator signal of frequency X+N;
  (2) first mixer means responsive to said output signal and to said first local oscillator signal for producing a first difference signal of frequency N;
  (3) first divider means for dividing by an amount A said first local oscillator signal to produce said first divided signal of frequency (X+N)/A supplied to said master comparator means; and
  (4) first comparator means for producing a first control signal by comparing first divided signal with said first difference signal, said first control signal being supplied to said first local oscillator means to control the frequency of said first local oscillator signal;

(c) second feedback loop means comprising:
  (1) multiplier means for multiplying said output signal by an amount B to produce a multiplied signal of a frequency XB;
  (2) second local oscillator means for generating a second local oscillator signal of frequency XB−D;
  (3) second mixer means responsive to said output signal and to said second local oscillator signal to produce a second difference signal of frequency D;
  (4) second divider means for dividing by an amount E said second local oscillator signal to produce said second divided signal of frequency (XB−D)/E supplied to said master comparator means; and
  (5) second comparator means for producing a second control signal by comparing said second divided signal with said second difference signal, said second control signal being supplied to said second local oscillator means to control the frequency of said second local oscillator signal.

10. The signal generator of claim 9, wherein said value for B is 2.

11. The signal generator of claim 9, wherein the value of N is equal to the value of D when the output signal is locked up on the preselected frequency value X.

12. The signal generator of claim 9, wherein the value of A is 3.

13. The signal generator of claim 9, wherein the value of E is 3.

14. The signal generator of claim 9, wherein the value of A is equal to the value of E.

15. A signal generator, which comprises:
(a) master loop means, comprising:
  (1) master oscillator means for generating an output signal having a preselected value X;
  (2) master divider means for dividing said output signal by an amount D to produce a first signal of a frequency N;
  (3) balanced mixer means responsive to said output signal and said first signal to produce a sum signal of a frequency X+N and a difference signal of a frequency X−N;
  (4) master comparator for generating a master control signal used to control the frequency of said output signal, said master control signal generated in accordance with the frequency difference between a first divided signal and a second divided signal;

(b) first feedback loop means comprising:
  (1) first local oscillator means for generating a first local oscillator signal of a frequency X″;
  (2) first mixer means responsive to said difference signal and to said first local oscillator signal for producing a first difference signal of frequency N;
  (3) first divider means for dividing by an amount M′ said first local oscillator signal to produce said first divided signal of frequency X″/M′ supplied to said master comparator means; and
  (4) first comparator means for producing a first control signal by comparing said first divided signal with said first difference signal, said first control signal being supplied to said first local oscillator means to control the frequency of said first local oscillator signal;

(c) second feedback loop means comprising:
  (1) second local oscillator means for generating a second local oscillator signal of frequency X′;
  (2) second mixer means responsive to said sum signal and to said second local oscillator signal to produce a second difference signal of frequency N;
  (3) second divider means for dividing by an amount M said second local oscillator signal to produce said second divided signal of frequency X′/M supplied to said master comparator means; and
  (4) second comparator means for producing a second control signal by comparing said second divided signal with said second difference signal, said second control signal being supplied to said second local oscillator means to control the frequency of said second local oscillator signal.

16. The signal generator of claim 15, wherein the frequency value X′ is equal to the frequency value X″ when said master oscillator means is locked up on the preselected frequency X.

17. The signal generator of claim 15, wherein the values of D and M are positive integers.

18. The signal generator of claim 15, wherein said master oscillator means is a voltage controlled oscillator.

19. The signal generator of claim 15, wherein said master oscillator means comprises a voltage crystal controlled oscillator.

20. The signal generator of claim 15, wherein the master divider includes a shift register means.

* * * * *